United States Patent
Seo

(10) Patent No.: US 7,354,825 B2
(45) Date of Patent: Apr. 8, 2008

(54) METHODS AND APPARATUS TO FORM GATES IN SEMICONDUCTOR DEVICES

(75) Inventor: Young-Hun Seo, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 129 days.

(21) Appl. No.: 10/736,063

(22) Filed: Dec. 15, 2003

(65) Prior Publication Data
US 2004/0127007 A1 Jul. 1, 2004

(30) Foreign Application Priority Data
Dec. 24, 2002 (KR) ............. 10-2002-0083421

(51) Int. Cl.
*H01L 31/336* (2006.01)
*H01L 29/76* (2006.01)

(52) U.S. Cl. ................. 438/267; 257/329

(58) Field of Classification Search ........ 438/184, 438/211, 250, 216, 303, 361, 430, 446, 585, 438/587, 595, 639, 696, 697, 165, 219, 267, 438/304, 596; 257/329, 332, E29.262, E29.318
See application file for complete search history.

(56) References Cited

U.S. PATENT DOCUMENTS

| | | | | |
|---|---|---|---|---|
| 4,645,563 A * | 2/1987 | Terada | ............. | 438/179 |
| 5,479,368 A | 12/1995 | Keshtbod | ............. | 365/185.01 |
| 5,612,237 A * | 3/1997 | Ahn | ............. | 438/264 |
| 6,054,345 A * | 4/2000 | Alsmeier et al. | ............. | 438/238 |
| 6,093,945 A * | 7/2000 | Yang | ............. | 257/317 |
| 6,207,510 B1 * | 3/2001 | Abeln et al. | ............. | 438/276 |
| 6,245,614 B1 * | 6/2001 | Hsieh | ............. | 438/267 |
| 6,258,679 B1 * | 7/2001 | Burns et al. | ............. | 438/303 |
| 6,358,827 B1 | 3/2002 | Chen et al. | ............. | 438/585 |
| 6,383,872 B1 * | 5/2002 | Kadosh et al. | ............. | 438/279 |
| 6,569,736 B1 | 5/2003 | Hsu et al. | ............. | 438/267 |
| 6,583,009 B1 | 6/2003 | Hui et al. | ............. | 438/264 |
| 6,667,237 B1 * | 12/2003 | Metzler | ............. | 438/690 |
| 6,720,219 B2 * | 4/2004 | Huang | ............. | 438/264 |
| 6,734,055 B1 * | 5/2004 | Lin et al. | ............. | 438/201 |
| 6,740,557 B1 * | 5/2004 | Lin | ............. | 438/267 |
| 6,750,108 B2 * | 6/2004 | Ueda | ............. | 438/303 |
| 6,800,526 B2 * | 10/2004 | Lin et al. | ............. | 438/267 |
| 6,847,068 B2 * | 1/2005 | Chuang et al. | ............. | 257/260 |
| 2002/0001935 A1 * | 1/2002 | Kim et al. | ............. | 438/595 |
| 2002/0052085 A1 * | 5/2002 | Hwang et al. | ............. | 438/283 |
| 2002/0072170 A1 * | 6/2002 | Lam | ............. | 438/239 |
| 2002/0197810 A1 * | 12/2002 | Hanafi et al. | ............. | 438/330 |
| 2003/0139010 A1 * | 7/2003 | Wang | ............. | 438/257 |
| 2004/0094784 A1 * | 5/2004 | Rhodes et al. | ............. | 257/291 |

* cited by examiner

*Primary Examiner*—Calvin Lee
(74) *Attorney, Agent, or Firm*—Andrew D. Fortney

(57) ABSTRACT

A method of formation a gate in a semiconductor device includes forming a gate oxide layer and a sacrificial layer on a semiconductor substrate. The sacrificial layer is then selectively etched to form a sidewall opening. Next, a polycrystalline silicon layer is formed on an area of the gate oxide layer exposed through the sidewall opening and on the sacrificial layer. Anisotropic etching of the polycrystalline silicon layer is performed such that sidewall gates are formed by remaining portions of the polycrystalline silicon layer on sidewalls of the sidewall opening, a width of the sidewall gates corresponding to a desired width of a gate. The sacrificial layer is removed following etching of the polycrystalline silicon layer.

20 Claims, 2 Drawing Sheets

METHODS AND APPARATUS TO FORM GATES IN SEMICONDUCTOR DEVICES

TECHNICAL FIELD

The present disclosure relates to semiconductor device manufacturing and, more particularly, to methods and apparatus to form gates in semiconductor devices.

BACKGROUND

The metal-oxide-semiconductor (MOS) transistor is one type of field effect transistor (FET). The MOS transistor typically includes a source, a drain region, a gate oxide layer, and a gate formed on a semiconductor substrate.

According to a conventional method of manufacturing a MOS transistor device, a gate oxide layer is formed on a device active region of a semiconductor substrate. Next, a polycrystalline silicon layer is formed on the gate oxide layer and a photoresist layer is deposited on the polycrystalline silicon layer. The photoresist layer is then exposed and developed to form a photoresist layer pattern that exposes and covers predetermined areas of the polycrystalline silicon layer.

Subsequently, using a process such as end point detection (EDP), the photoresist layer pattern is used as a mask to etch the exposed areas of the polycrystalline silicon layer. As a result, a predetermined width of the polycrystalline silicon layer that remains forms a gate of the MOS transistor device.

However, during the exposing and developing of the photoresist layer, because light is reflected from the polycrystalline silicon layer formed thereunder, it is difficult to form a pattern to precise and desired dimensions. This problem becomes more severe as higher levels of integration are pursued, that is, as pattern dimensions decrease in size.

With continuous increases in the level of device integration, it is becoming more and more difficult to realize a MOS transistor gate having a small width. To overcome this difficulty, an organic or inorganic anti-reflection coating (ARC) is formed on the polycrystalline silicon layer. However, even with the use of an ARC, limits with regard to the patterning dimensions of the photoresist layer remain. In particular, using present patterning processes, a gate having a width of 0.18 μm may be formed, but it becomes difficult to form a gate having a smaller width of, for example, 0.15 μm or 0.13 μm, 0.09 μm, etc.

Conventional techniques related to forming a gate of a small width are disclosed in U.S. Pat. Nos. 6,583,009; 6,569,736; 5,479,368; and 6,358,827.

DETAILED DESCRIPTION

An example method will now be described in detail with reference to the accompanying drawings. FIGS. 1a through 1d are sectional views used to describe a semiconductor device manufacturing method.

As disclosed herein, to overcome dimensional limitations with respect to patterning processes in which a photoresist layer is exposed and developed, a photoresist layer is not used, and, instead, a sidewall material is left remaining on side walls as an etch-back to form a gate. A method for realizing such a configuration is described below with reference to FIGS. 1a-1d.

Figure 1A:
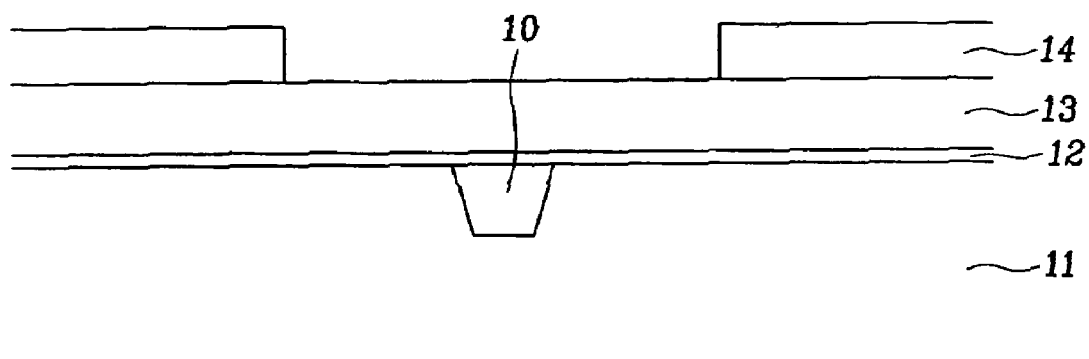
FIGS. 1a through 1d are sectional views used to describe a semiconductor device manufacturing method.

Referring first to FIG. 1a, a gate oxide layer 12 is formed on a semiconductor substrate 11 that is divided by a trench 10 into an active region and an isolation region. A nitride layer 13 is formed as a sacrificial layer on the gate oxide layer 12.

The nitride layer 13 is used in the process of forming sidewalls of a subsequent step. A thickness of the nitride layer 13 is determined by considering a desired width of a gate.

Subsequently, a photoresist layer is deposited on the nitride layer 13, then the photoresist layer is exposed and developed to form a photoresist layer pattern 14 that exposes a predetermined area of the nitride layer 13 (i.e., a predetermined width of the nitride layer 13 when a cross section of the semiconductor device is viewed). If the width of the opening of the photoresist layer pattern 14 is formed such that it encompasses an area from where one gate is to be formed to where an adjacent gate is to be formed, it is possible to form two gates simultaneously.

Figure 1B:
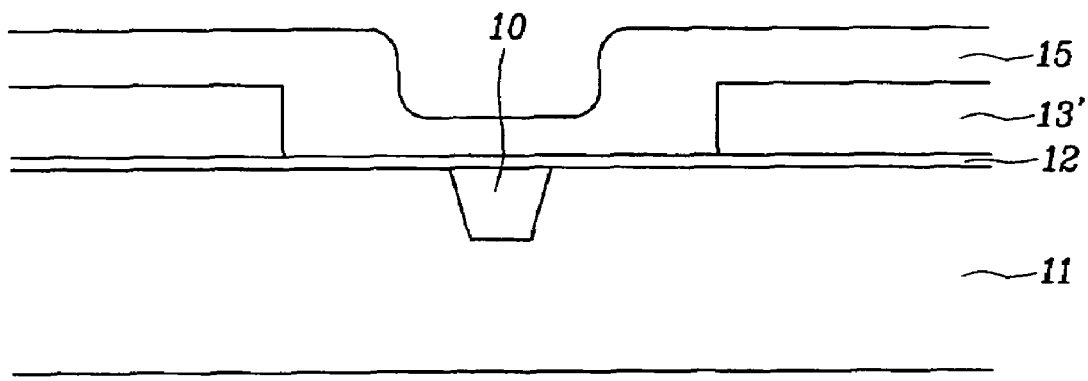

Next, with reference to FIG. 1b, using the photoresist layer pattern 14 as a mask, the exposed area of the nitride layer 13 is etched to form a nitride layer pattern 13'. The photoresist layer pattern 14 is removed following etching and a cleaning process is performed. Following removal of the photoresist layer pattern 14, a polycrystalline silicon layer 15 is formed over all exposed elements of the nitride layer pattern 13' and the gate oxide layer 12.

Figure 1C:
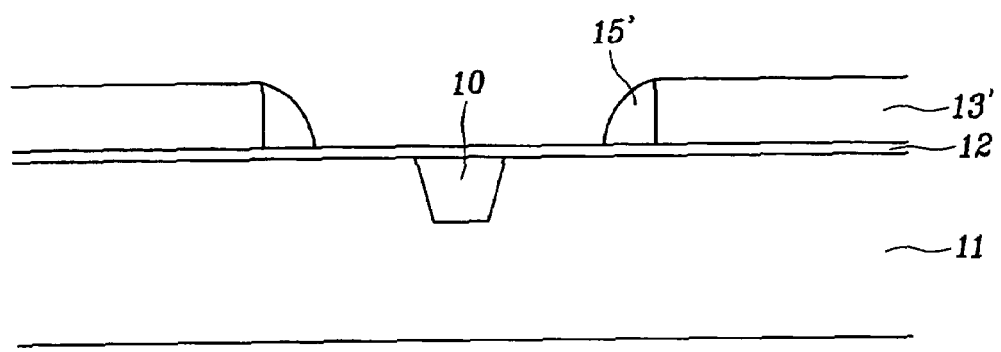

Subsequently. referring to FIG. 1c, using the polycrystalline silicon layer 15 as an etch-back, sidewall gates 15' are formed by leaving predetermined amounts of the polycrystalline silicon layer 15 on vertical wall areas of the nitride layer pattern 13'. In the etch-back forming process, a degree of over-etch is dictated by a desired gate width. That is, the smaller the desired gate width, the greater the amount of over-etch that needs to be performed such that the sidewall gates 15' are formed to a minimal width, As will be readily appreciated by those having ordinary skill in the art, it is possible to use an anisotropic etching process rather than an etch-back process.

Figure 1D:
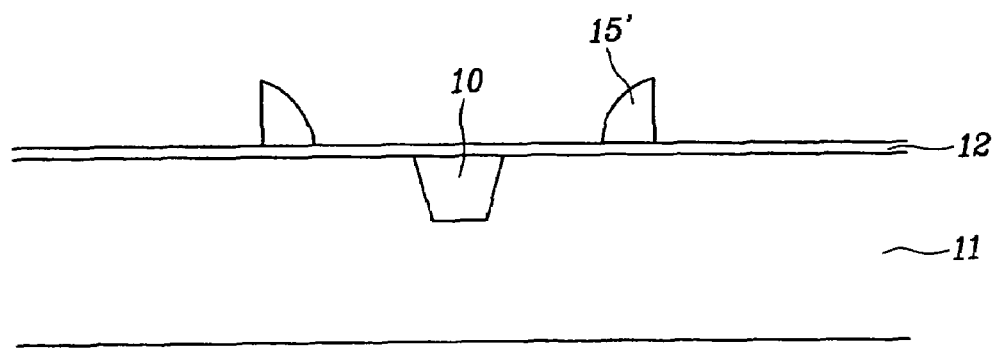

Next, with reference to FIG. 1d, the nitride layer pattern 13' is removed. Conventional transistor manufacturing processes may be performed following removal of the nitride layer pattern 13'.

As described above, a gate of a sidewall formation having a width corresponding to a desired width is formed using an etch-back method. As a result, a gate of a width smaller than realizable using conventional methods may be formed such that the device may be made to smaller sizes.

As disclosed above, in one example, a formation method of a gate in a semiconductor device in which the gate is formed having a minimal width is provided. In one example, the method may include forming a gate oxide layer and a sacrificial layer on a semiconductor substrate, in this sequence. The sacrificial layer is then selectively etched to form a sidewall opening. A polycrystalline silicon layer is then formed on an area of the gate oxide layer exposed through the sidewall opening and on the sacrificial layer. Anisotropic etching of the polycrystalline silicon layer is performed such that sidewall gates are formed by remaining portions of the polycrystalline silicon layer on sidewalls of the sidewall opening. In such an arrangement, a width of the sidewall gates corresponds to a desired width of a gate. The sacrificial layer is removed following etching of the polycrystalline silicon layer. For example, a nitride layer may be used as the sacrificial layer. The sacrificial layer or nitride layer may be removed using a wet etching process.

Anisotropic etching of the polycrystalline layer may include an etch-back process.

The width of the sidewall gates is determined by a thickness of the sacrificial layer. The width of the sidewall opening formed by selectively etching the sacrificial layer corresponds to a width from one gate to an adjacent gate.

Although certain methods in accordance with the teachings of the invention have been described herein, the scope of coverage of this patent is not limited thereto. On the contrary, this patent covers every apparatus, method, and article of manufacture fairly falling within the scope of the appended claims either literally or under the doctrine of equivalents.

What is claimed is:

1. A method of forming gates in a semiconductor device, the method comprising:
    forming a shallow trench isolation (STI) to define an active region in a semiconductor substrate;
    forming a gate oxide layer on the semiconductor substrate;
    depositing a sacrificial layer on the semiconductor substrate to a thickness that determines a width of the gates;
    selectively etching the sacrificial layer to form a sidewall opening over the active region of the semiconductor substrate and the STI until the gate oxide is exposed;
    forming a polycrystalline silicon layer on an area of the gate oxide layer exposed through the sidewall opening and on the sacrificial layer;
    anisotropically etching the polycrystalline silicon layer such that the gates remain on sidewalls of the sidewall opening, the gates having the width; and
    removing the sacrificial layer.

2. A method as defined by claim 1, wherein the sacrificial layer comprises a nitride layer.

3. A method as defined by of claim 2, wherein removing the nitride layer comprises a wet etching process.

4. A method as defined by claim 1, wherein removing the sacrificial layer comprises a wet etching process.

5. A method as defined by claim 1, wherein anisotropically etching the polycrystalline layer comprises an etch-back process.

6. The method of claim 5, wherein the etch-back process comprises over etching the sidewall gates to minimum width.

7. A method as defined by claim 1, wherein a thickness of the sacrificial layer determines widths of the sidewall gates.

8. A method as defined by claim 1, wherein the width of the sidewall opening corresponds to a distance from one gate to an adjacent gate.

9. A method as defined by claim 8, wherein the sacrificial layer comprises a nitride layer.

10. A method as defined by claim 9, wherein removing the nitride layer comprises a wet etching process.

11. A method as defined by claim 8, wherein removing the sacrificial layer comprises a wet etching process.

12. A method as defined by claim 8, wherein anisotropically etching the polycrystalline layer comprises an etch-back process.

13. The method of claim 12, wherein the etch-back process comprises over etching the sidewall gates to the minimum width.

14. The method of claim 1, further comprising depositing a photoresist layer on the sacrificial layer.

15. The method of claim 14, further comprising patterning the photoresist layer to form an opening exposing a predetermined area of the sacrificial layer.

16. The method of claim 15, wherein the opening encompasses an area on the substrate from where one sidewall gate will be formed to where an adjacent gate will be formed.

17. The method of claim 1, wherein forming the STI defines a plurality of active regions in the substrate, and etching the sacrificial layer forms an opening over at least two of the active regions and the STI.

18. The method of claim 1, wherein etching the sacrificial layer exposes the active region and the STI.

19. The method of claim 1, wherein anisotropically etching the polycrystalline silicon layer forms first and second sidewall gates on respective first and second sidewalls of the sacrificial layer and removes polycrystalline silicon above said STI and first and second portions of said substrate adjacent to said STI, said first and second portions of said substrate being between said STI and respective portions of said substrate below said first and second sidewall gates.

20. The method of claim 1, wherein anisotropically etching the polycrystalline silicon layer further comprises an over-etch.

* * * * *